United States Patent
Olivieri et al.

(10) Patent No.: US 7,583,693 B2
(45) Date of Patent: *Sep. 1, 2009

(54) SIGNAL CODING

(75) Inventors: Stefano Olivieri, Teramo (IT); Giuseppe Coppola, Vedano Al Lambro (IT)

(73) Assignee: Koninklijke Philips Electronics N.V., Eindoven (NL)

( * ) Notice: Subject to any disclaimer, the term of this patent is extended or adjusted under 35 U.S.C. 154(b) by 1838 days.

This patent is subject to a terminal disclaimer.

(21) Appl. No.: 09/906,607

(22) Filed: Jul. 17, 2001

(65) Prior Publication Data

US 2002/0012360 A1 Jan. 31, 2002

(30) Foreign Application Priority Data

Jul. 17, 2000 (EP) ................................. 00202529

(51) Int. Cl.
 *H04J 3/16* (2006.01)
 *H04J 3/02* (2006.01)
(52) U.S. Cl. ...................... 370/465; 370/537; 375/253; 375/260
(58) Field of Classification Search ......... 370/465–477, 370/486–487, 529, 537; 375/134, 137, 240, 375/253, 260; 714/52, 746
See application file for complete search history.

(56) References Cited

U.S. PATENT DOCUMENTS

| | | | | | |
|---|---|---|---|---|---|
| 5,745,504 | A | * | 4/1998 | Bång | 714/752 |
| 5,771,102 | A | * | 6/1998 | Vogt et al. | 358/426.02 |
| 5,818,537 | A | * | 10/1998 | Enokida et al. | 348/441 |
| 6,028,896 | A | * | 2/2000 | Jang et al. | 375/240.04 |
| 6,125,343 | A | * | 9/2000 | Schuster | 704/201 |
| 6,141,781 | A | * | 10/2000 | Mueller | 714/722 |
| 6,282,241 | B1 | * | 8/2001 | Saw | 375/240.01 |
| 6,353,637 | B1 | * | 3/2002 | Mansour et al. | 375/260 |
| 6,405,338 | B1 | * | 6/2002 | Sinha et al. | 714/752 |
| 6,553,145 | B1 | * | 4/2003 | Kang et al. | 714/795 |
| 6,681,365 | B1 | * | 1/2004 | Anand et al. | 714/790 |

(Continued)

FOREIGN PATENT DOCUMENTS

EP 0 936 772 A2 8/1999

OTHER PUBLICATIONS

Hoeher et al., "Performance of an RCPC-Coded OFDM-based Digital Audio Broadcasting (DAB) System", Jan. 1991, GLOBECOM '91, CH2980-1/91 IEEE, pp. 40-46.*

(Continued)

*Primary Examiner*—Andrew Lee

(57) ABSTRACT

The invention provides signal coding, wherein the signal is source coded to obtain a coded data stream, and source significance information (SSI) is included into the coded data stream, the source significance information (SSI) indicating desired protection rates of respective parts of the coded data stream. In this way, a channel encoder may obtain the source significance information (SSI) from the coded data stream, which is advantageous in presence of intermediate network layers. Preferably, the coded data stream comprises respective packets, the being included in respective headers associated with the respective packets, a given header indicating desired protection rates for respective parts ($p_i''$) of the associated packet. In order to provide easy detection of the source significance information (SSI), a first header ($SSI^1$) is placed at a beginning of the coded data stream. Alternatively, the header ($SSI^1$) is provided with an identifier.

15 Claims, 5 Drawing Sheets

U.S. PATENT DOCUMENTS

| | | | |
|---|---|---|---|
| 6,721,337 B1 * | 4/2004 | Kroeger et al. | 370/477 |
| 6,754,277 B1 * | 6/2004 | Heinzelman et al. | 375/240.27 |
| 6,799,294 B1 * | 9/2004 | Chung et al. | 714/786 |
| 6,851,083 B1 * | 2/2005 | Hagenauer et al. | 714/774 |
| 6,920,179 B1 * | 7/2005 | Anand et al. | 375/240.26 |
| 6,973,610 B1 * | 12/2005 | Xu | 714/752 |
| 7,031,350 B2 * | 4/2006 | Martini et al. | 370/537 |
| 2006/0013321 A1 * | 1/2006 | Sekiguchi et al. | 375/240.27 |

OTHER PUBLICATIONS

Hagenauer et al. ("The Performance of Rate-Compatible Punctured Convolution Codes for Digital Mobile Radio", IEEE Transactions on Communications, vol. 38, No. 7, Jul. 1990, pp. 966-980).*

By John G. Proakis, Entitled "Digital Communications" $2^{ND}$ Edition, McGraw-Hill, 1989, pp. 801-817.

Spread Spectrum Signals for Digital Communications, Entitled: Generation of PN, pp. 831, 836, Mar. 1990.

By R. Talluri, Entitled: "Error-Resilient Video Coding in the ISO MPEG-4 Standard", IEEE Communication Magazine, vol. 36, No. 6, Jun. 1988, pp. 112-119.

By J. Hagenauer, Entitled: Rate Compatible Punctured Convolutional Codes (RCPC Codes) and Their Application, IEEE Trans. Commun., vol. 36, No. 4, Apr. 1988 pp. 389-400.

By Joachim Hagenauer Entitled: Channel Coding and Transmission Aspects for Wireless Multimedia, Proceedings of the IEEE, vol. 87, No. 10, Oct. 1999. pp. 1764-1777.

By W. Rabiner Heinzelman et al. Entitled: Unequal Error Protection of MPEG-4 Compressed Video, ICIP 1999.

M. Budagavi et al. Entitled: "Wireless MPEG-4 Video Communication on DSP Chips", IEEE Signal Processing Jan. 2000, pp. 36-53.

Cox R V et al "Combined Subband Source Coding And Convolutional Channel Coding Gemeinsame Teilband," NTG Fachberichte, VDE Verlag, Berlin, DE, 1988, pp. 23-30.

A. Aydin Alatan et al., "Unequal Error Protection of SPIHT Encoded Image Bit Streams", IEEE Journal on Selected Areas in Communications, vol. 18, No. 6, Jun. 2000.

* cited by examiner

SIGNAL CODING

The invention relates to coding a signal.

The invention further relates to channel coding.

The article of Hagenauer, J. and Stockhammer, T., 'Channel Coding and Transmission Aspects for Wireless Multimedia', Proceedings of the IEEE, Vol. 87, No. 10, October 1999, discloses joint source/channel coding and decoding methods for multimedia. Multimedia has to handle a variety of compressed and uncompressed source signals such as data, text, image, audio and video. On wireless channels the error rates are high and joint source/channel coding and decoding methods are advantageous.

In the heterogeneous world of communication the layered structure is an important feature for standardization, design and implementation. Usually one layer only communicates with the corresponding layer at the receiver side by using the lower layers to fulfil the requests of the upper layer. For both standardization and implementation, only the definition of interfaces and tasks for each layer is necessary, whereby the interface definition is quite simple. The layer is usually described using a state machine. There also exists a very clear separation in the layer model: end-to-end applications are transported over different physical media like optical fiber, copper wires, or wireless within one connection.

In contrast to the layered structure, an optimization of compression and transmission stretching across the layers might be useful in the mobile environment. The source coding scheme and even the application control could be influenced by the state of the mobile channel and the available resources. Some services might be restricted because of error, complexity, and delay constraints. Communication systems optimized to both the application and the channel might be of interest in the future for very bandwidth and power efficient transmission.

If there is some knowledge about the source properties, i.e., bit sensitivity measurements or source significance information, or if the application provides base information separated from enhancement information, Unequal Error Protection (UEP) methods should be applied by using advanced channel coding algorithms or modulation techniques. The more important base information is highly protected to guarantee delivery, the less important enhancement information is either low protected or in bad channel conditions even not transmitted.

FIG. 1 shows a part of the simplest transmission scheme over a non-frequency selective fading channel for a single application. The different blocks of source 1, channel encoder 2, transmission channel 3, channel decoder 4, and source decoder 5 are linked in a variety of ways. A source signal u is furnished from the source encoder 1 to the channel encoder 2 to obtain a channel encoded signal x. The channel encoded signal x is transmitted over the transmission channel 3 and corrupted, resulting in a corrupted signal y. The corrupted signal y is decoded in the channel decoder 4 to obtain a channel decoded signal û, which is furnished to the source decoder 5. The channel and the decoder are not to be connected by the hard decisions of the demodulator/detector only. Soft decisions and Channel State Information (CSI) are passed on. Source Significance Information (SSI) is passed to the channel encoder 2 for static or dynamic UEP. SSI might be derived by evaluating the decoded application under the assumption that a certain part of a packet is missing or wrong.

An object of the invention is to provide advantageous signal coding. To this end, the invention provides coding, channel coding, a coded data stream, and a storage medium as defined in the independent claims. Advantageous embodiments are defined in the dependent claims. The invention is especially advantageous in presence of intermediate layers, e.g. protocol layers for networked devices.

According to a first aspect of the invention, a signal is source coded to obtain a coded data stream and source significance information (SSI) is included in the coded data stream, the source significance information indicating desired protection rates of respective parts of the coded data stream. The invention provides advantageous exchange of information between source and channel encoder in the presence of intermediate network layers, thereby allowing UEP beneficial advantages to be effectively applied to the design of wireless networked architectures and devices, e.g. cellular networks. The invention may be used in circuit-switched as well as packet-switched networks. By including SSI in the coded data stream, the SSI is obtainable from the coded bit-stream, keeping interfacing between coding layers simple. Including SSI info in the coded data stream has the consequence that a channel encoder should be arranged to extract the SSI information from the coded bit-stream. SSI transmitted from source coder to channel encoder indicates the desired protection rates. A channel encoder according to the invention, channel codes the coded data stream under control of the identified SSI. Preferably the channel encoder also takes into account a state of the transmission channel. In this way, respective parts of the coded data stream are channel coded with respective error protection rates under control of the SSI in the coded data stream obtained from the source coder and the state of the transmission channel. Therefore, the actual error protection rates of the channel coded data stream are not necessarily the same as the desired error protection rates indicated by the SSI obtained from the source encoder. The channel encoder may also decide to omit transmission of given information in the case that channel conditions are do not meet a certain required bandwidth.

Advantageously, the SSI includes respective lengths of the respective parts of the coded data stream. This aspect of the invention provides advantageous coding for variable lengths of the parts of the coded data stream.

Advantageously, the SSI is included in respective headers that are associated with respective packets, a given SSI header indicating desired protection rates for respective parts of the associated packet. This aspect of the invention provides an advantageous exchange of information between source and channel encoder in a coding system that uses packets.

Advantageously, the SSI header includes an offset which indicates a start position of the associated packet. In this way, the channel encoder is provided with a pointer to the coded data stream to directly access the coded data stream at the start position of the packet to be channel coded.

Preferably, the SSI is included in the coded data stream in such a way that it can be easily identified by a channel encoder, which channel encoder has been arranged according to the invention. Preferably, the SSI should be available to the channel encoder without having to decode the coded data stream at the channel encoder. Further embodiments of the invention provide advantageous ways in identifying the SSI in the channel encoder.

Advantageously, the SSI header of the first packet in a group of packets, i.e. the first SSI header, is placed at the beginning of the group of packets. This embodiment provides an easy access to the SSI header. This embodiment requires that at each intermediate coding layer, the SSI header is replaced at the beginning of the group of packets and that the offset in the first SSI header is updated to take header lengths of intermediate coding layers into account.

Alternatively, the first header is provided with an identifier, preferably just in front of the first SSI header. This embodiment has the further advantage that the SSI header is transparent to the network. The identifier may be a pseudo-random word or any kind of identifier known in the art. Preferably, the pseudo-random word is a pseudo-noise sequence. Reference is made to John G. Proakis, 'Digital communications', $2^{nd}$ edition, McGraw-Hill, 1989, pp. 801-817, pp. 831-836. A preferred pseudo-noise sequence is a Gold sequence, which is known in the art. Pseudo-noise sequences have auto-correlation properties particularly suitable for detection and/or synchronization. A channel encoder according to the invention is arranged to identify the identifier and consequently the first SSI header.

Although the invention is preferably applied to provide a channel encoder with source significance information, the SSI that has been included in the coded data stream is alternatively applied in transmitting SSI from channel encoder to channel decoder over a channel.

A preferable field of application of the invention, is wireless transmission of MPEG-4 video. The article of Heinzelman, W. R., Budagavi, M. and Talluni, R., 'Unequal Error Protection of MPEG-4 Compressed Video', Proceedings of the International Conference on Image Processing (ICIP), October 1999, discloses that the structure of an MPEG-4 compressed bit-stream lends itself to using unequal error protection to ensure fewer errors in the important portions of the bit-stream.

Alternatively, the coded data stream may be recorded to a computer-readable medium, and transmission being effected by distributing the recorded computer-readable medium.

The aforementioned and other aspects of the invention will be apparent from and elucidated with reference to the embodiments described hereinafter.

The drawings only show those elements that are necessary to understand the invention.

In UEP, a channel encoder/decoder, running on a physical layer is able to encode/decode parts of the stream with a different rate according to the SSI received from the source.

In the following, an MPEG-4 encoder is considered running on an application layer, which encoder is delivering a video stream to an end user. To simplify, it is supposed that the video stream is divided into groups of N video packets, e.g. in frames, and that the groups are not broken up into smaller units at a given layer (a person skilled in the art, after having read this description, will straightforwardly make the extension to the case wherein the groups are broken up). In the following, the discussion is focused on the transmission of a single group of N MPEG-4 video packets.

Figure 1:
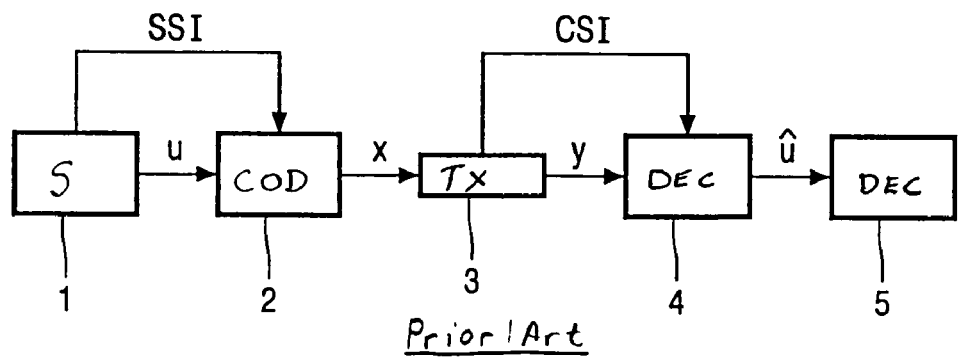
FIG. 1 shows a block diagram of a coding arrangement as known from the prior art.
Figure 2:
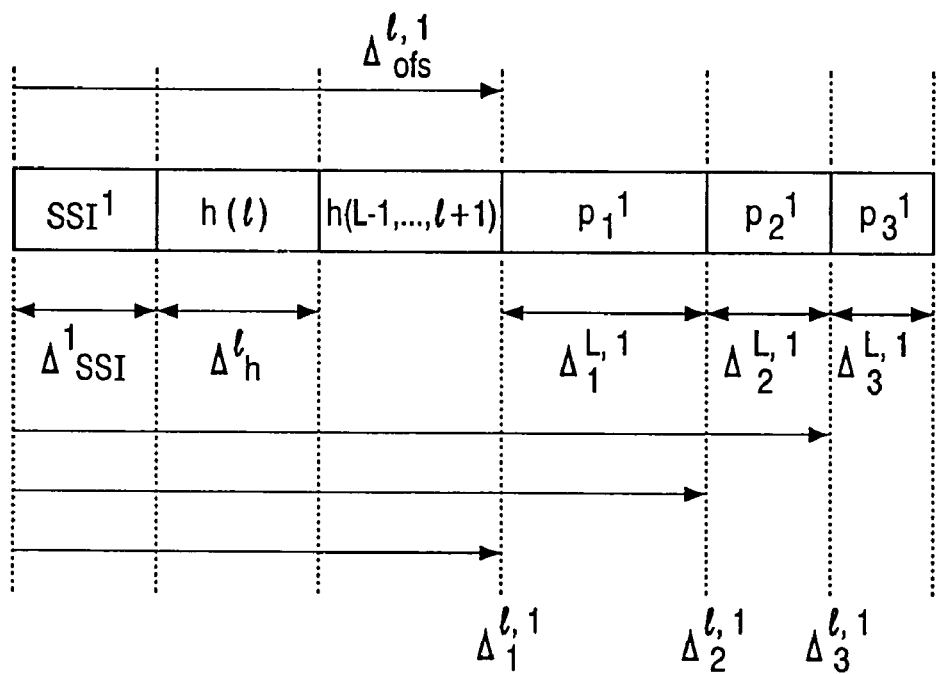
FIG. 2 shows an embodiment of including an SSI header in a packet.
Figure 4:
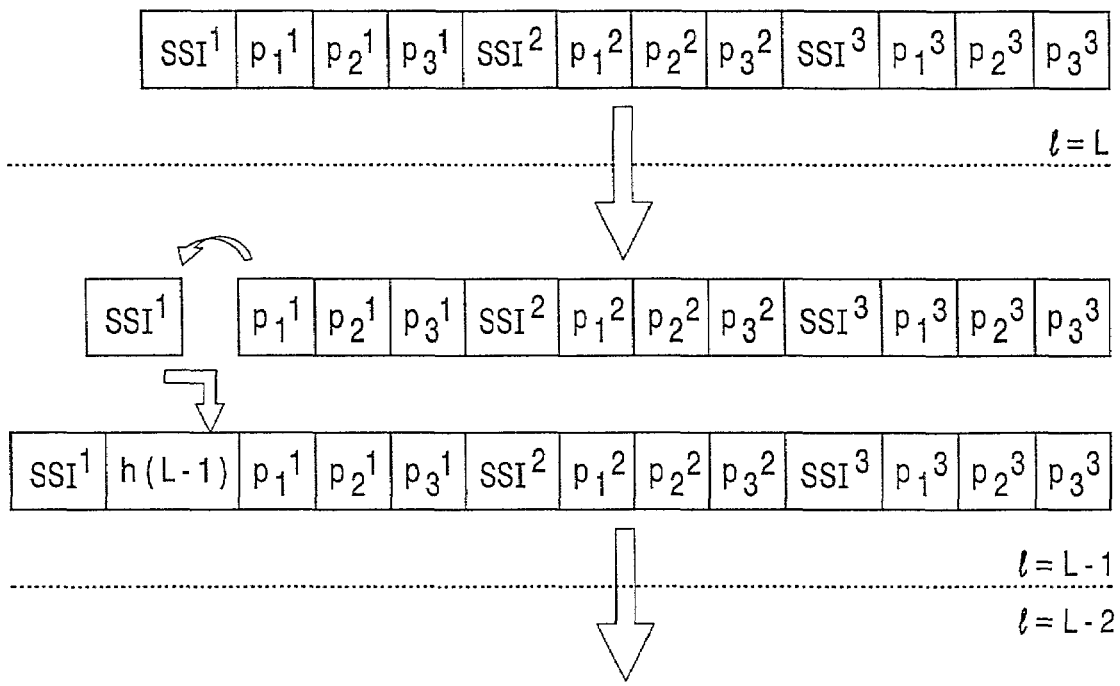
FIG. 4 shows managing of an SSI header of a first packet in a coded bit-stream according to an embodiment of the invention.
Figure 5:
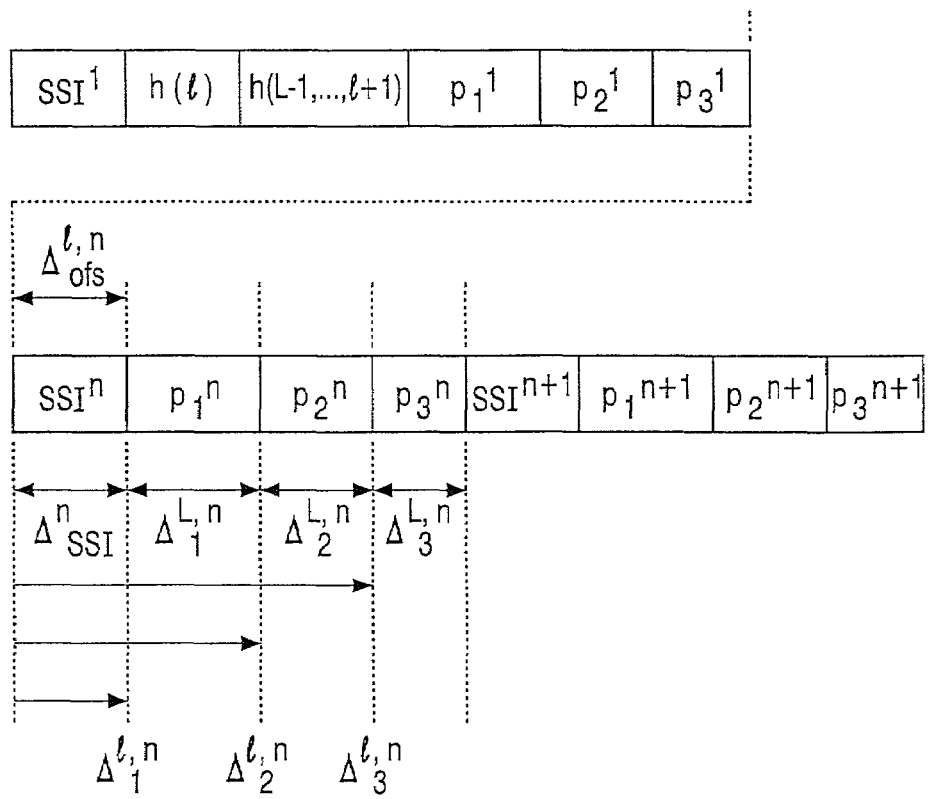
FIG. 5 shows managing of SSI headers of remaining packets according to an embodiment of the invention.

According to an aspect of the invention, respective SSI headers are incorporated in a coded data stream comprising respective packets, wherein a given SSI header is associated with a given packet. See FIG. 2 of an example of a packet, having an SSI header. An MPEG-4 video packet basically comprises a video packet header $p_1$, motion information $p_2$ (in the case of a predictively coded frame), and texture information $p_3$, each part of the packet having variable size $\Delta_l^L$. Although not shown in FIG. 2, an MPEG-4 packet normally comprises stuffing bits at the end of the packet, i.e. after the texture information $p_3$. These stuffing bits should get a protection similar to the header of the packet $p_1$, because reversible decoding cannot be performed if this information is corrupted, and a following packet may be dropped if the stuffing bits are received in error. The header $p_1$ comprises the most important bits of the packet, the motion bits $p_2$ are next important and the texture bits $p_3$ are least important. Note that the importance of the parts of the packet is directly related to the SSI. Supposing that different protection rates are desired to perform UEP, the header $p_1$ should get a given protection $r_1$, the motion bits $P_2$ should get a lower level of protection $r_2$, and the texture bits $p_3$ should receive a lowest level of protection $r_3$. Layer L indicates an MPEG coding layer. At each subsequent layer l=L−1, . . . , 1 some processing is performed and a header h(l) is inserted in the coded data stream, usually at the beginning of the coded data stream. According to a preferred embodiment of the invention, the SSI header of the first packet, i.e. $SSI^1$ is replaced at the beginning of the coded bit-stream as shown in FIG. 4. Managing of SSI headers of remaining packets is shown in FIG. 5.

For each packet a start position of a packet part $p_i^n$ is given by:

$$\text{for } \Delta_i^{l,n} = \Delta_{i-1}^{l,n} + \Delta_{i-1}^{L,n} \quad (1)$$

for i≧2, wherein $\Delta_1^{l,n} = \Delta_{ofs}^{l,n}$

The offset $\Delta_{ofs}^{l,1}$ of a first packet is a summation of a current header length $\Delta_h^l$ and a previous offset $\Delta_{ofs}^{l+1,1}$ of the first packet, as indicated by:

$$\Delta_{ofs}^{l,1} = \Delta_h^l + \Delta_{ofs}^{l+1,1}, \ l=L, \ldots 1 \quad (2)$$

The offset $\Delta_{ofs}^{l,1}$ at layer L is equal to the length of the SSI header, i.e. $\Delta_h^{L,1} = \Delta_{SSI}$ and $\Delta_{ofs}^{L+1,1} = 0$.

Figure 3:
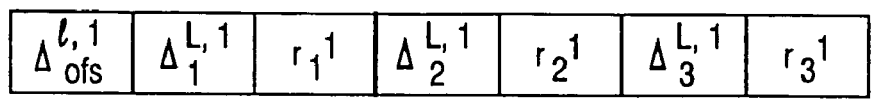
FIG. 3 shows an example of an SSI header.

The first SSI header preferably comprises the sizes $\Delta_l^{L,l}$, the rates $r_l^l$, and the offset $\Delta_{ofs}^{l,1}$. Such a preferred SSI header is shown in FIG. 3. In this way, the channel encoder receives both the size $\Delta_l^L$ of each part of the packet and the corresponding rate $r_l$.

Figure 6:
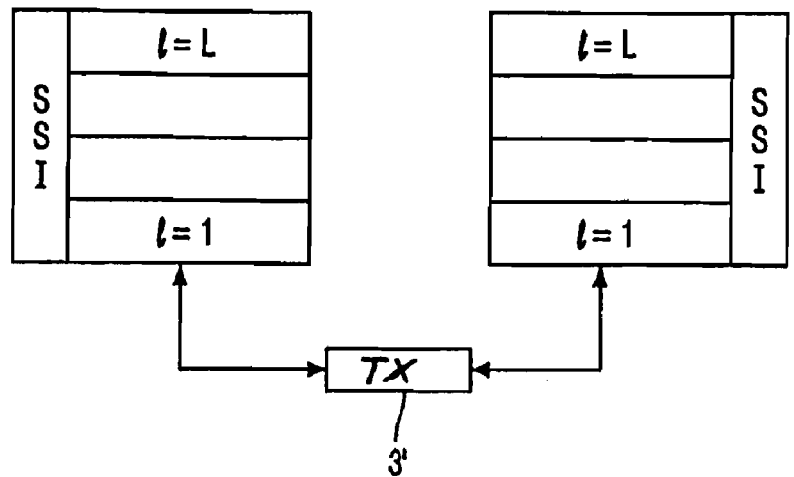
FIG. 6 shows a diagram of a vertical layer concept according to an embodiment of the invention.

In an embodiment according to FIG. 4, the offset $\Delta_{ofs}^{L,1}$, which takes into account the current layer's header length, needs to be updated at each layer in the way that the channel encoder is given the right pointer to encode correctly the different parts of the video packets. FIG. 4 shows that at each layer, the SSI header associated to the first MPEG-4 packet is placed at the beginning of the group of packets so that it can be immediately detected; moreover, the corresponding offset $\Delta_{ofs}^{l,1}$ is updated according to the current layer's length. For the remaining MPEG-4 video packets, the offset $\Delta_{ofs}^{l,n}$ (n=2, . . . , N) corresponds to the length of the respective SSI header $\Delta_{SSI}^n$. If all $\Delta_{SSI}^n$ have a predetermined length, it is possible to omit the offset $\Delta_{ofs}^{l,n}$ in the SSI header for n≧2, as long as the channel encoder takes into account $\Delta_{SSI}^n$. The SSI header so defined can be interpreted as a vertical layer extending across several layers 1, . . . , L, as shown in FIG. 6. Layer L denotes an MPEG-4 application, layer 1 a channel coding/physical layer. In this way, SSI may be carried among the layers through the vertical layer, which lets the channel encoder receive instantaneously all the information it needs to encode the video packets according to a UEP criterion. The vertical layer extending across the network layers therefore allows advantageous source adapted UEP.

Figure 7:
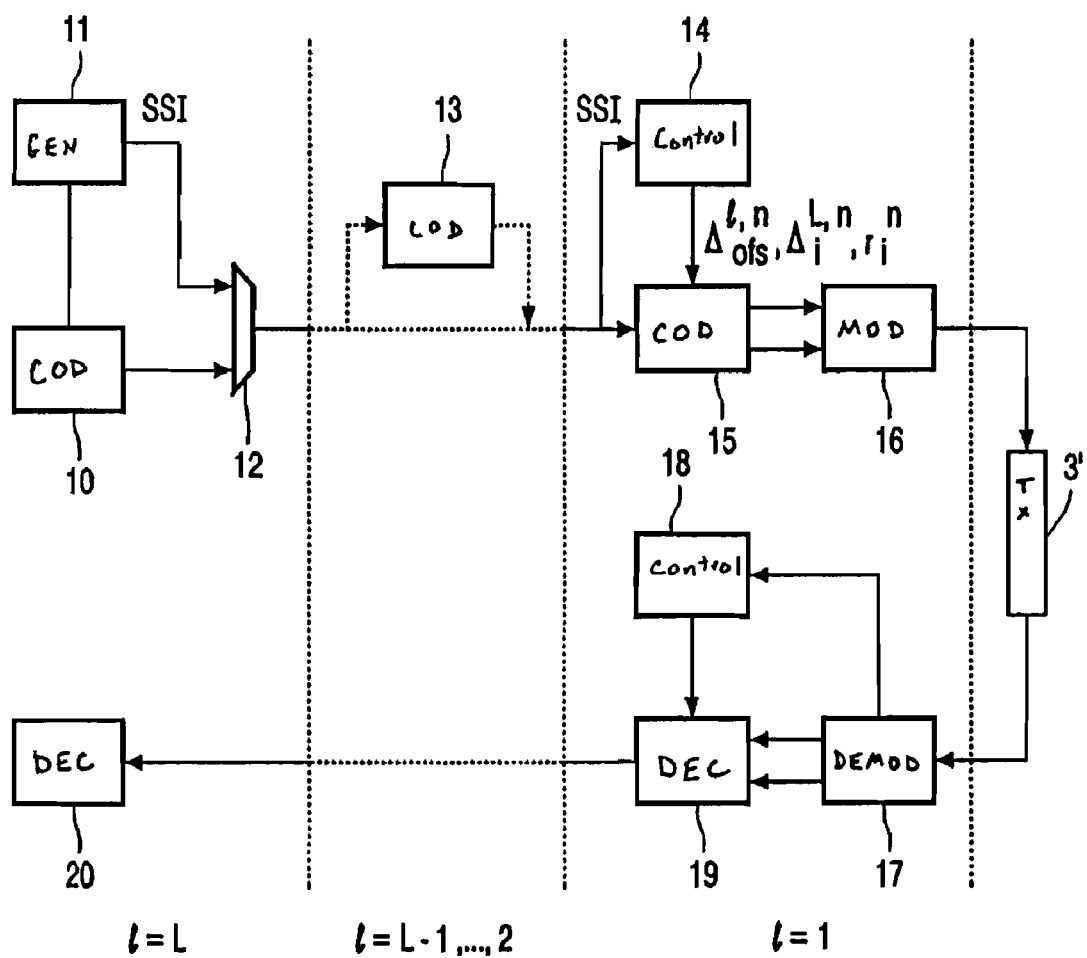
FIG. 7 shows a block diagram of a system according to an embodiment of the invention.

FIG. 7 shows a block diagram of a system according to an embodiment of the invention. At the application layer L, a source coder 10 (e.g. an MPEG-4 encoder) is shown, provided with an SSI header generation unit 11 and a multiplexer 12. The source coder 10 generates a coded data stream. The multiplexer 12 incorporates the SSI headers generated by the SSI header generation unit 11 into the coded data stream. At intermediate layers, an intermediate coder 13 performs a coding operation wherein the first SSI header is shifted and the offset updated similar to the coding operation illustrated in FIG. 4. Each layer L−1, . . . , 2 incorporates such a coder 13. At the channel coding/physical layer 1, a channel coder 15 is shown that is controlled by a controller 14. The controller 14 identifies the first SSI header. This is an easy operation, because in this embodiment the SSI header is present at the beginning of the coded data stream. Further SSI headers are identified by using offsets and lengths of the respective packet parts. Information available from the SSI headers is furnished to the channel encoder 15 which performs a channel coding operation on the coded data stream, in which respective parts of the coded data stream are coded with respective protection rates under control of the source significance information. A channel coded data stream generated by the channel coder 15 is furnished to a modulator 16 that performs a modulation operation to make the coded signal suitable for transmission over the channel 3'. The transmission channel 3' may alternatively be a storage medium. Each layer's resulting data stream, which includes SSI information according to an aspect of the invention, may be transmitted over such a channel, or may be stored on such a storage medium. At a receiver side, the transmitted data stream is received in a demodulator 17, which inter alia extracts control information from the transmitted data stream. The control information is furnished to a controller 18, which controls a channel decoder 19. The channel decoder furnishes a channel decoded signal through intermediate layers to a source decoder 20.

The channel coding may be performed according to any known source adapted channel coding mechanism. Preferably, the SSI headers according to the invention are transmitted to inform the channel decoder how the UEP operation in the channel encoder 15 has been performed. The channel encoder 15 should protect the SSI headers against channel errors and the channel decoder 19 should carry out a channel decoding operation to decode the SSI. In the case that the error protection rates in the channel encoding differs from the desired protection rates obtained from the original SSI headers, the SSI headers need to be updated to indicate the actual error protection rates used by the channel encoder 15.

Because the proposed technique requires management of the SSI header at each layer, additional processing at each layer is required relative to prior art systems.

An alternative embodiment of the invention, which prevents the additional processing at each layer and makes UEP transparent to the network, makes use of an identifier just in front of the SSI header. For example, a pseudo-random word may be placed just before the SSI header of the first MPEG-4 packet, so that it can be automatically detected by correlation techniques at the physical layer. The identifier adds further redundancy to the bit-stream and the detection of the identifier requires additional hardware and/or software resources at the physical layer for correlation computing. However, the advantage of this technique is that it enables UEP irrespective of the intermediate layers.

Figure 8:
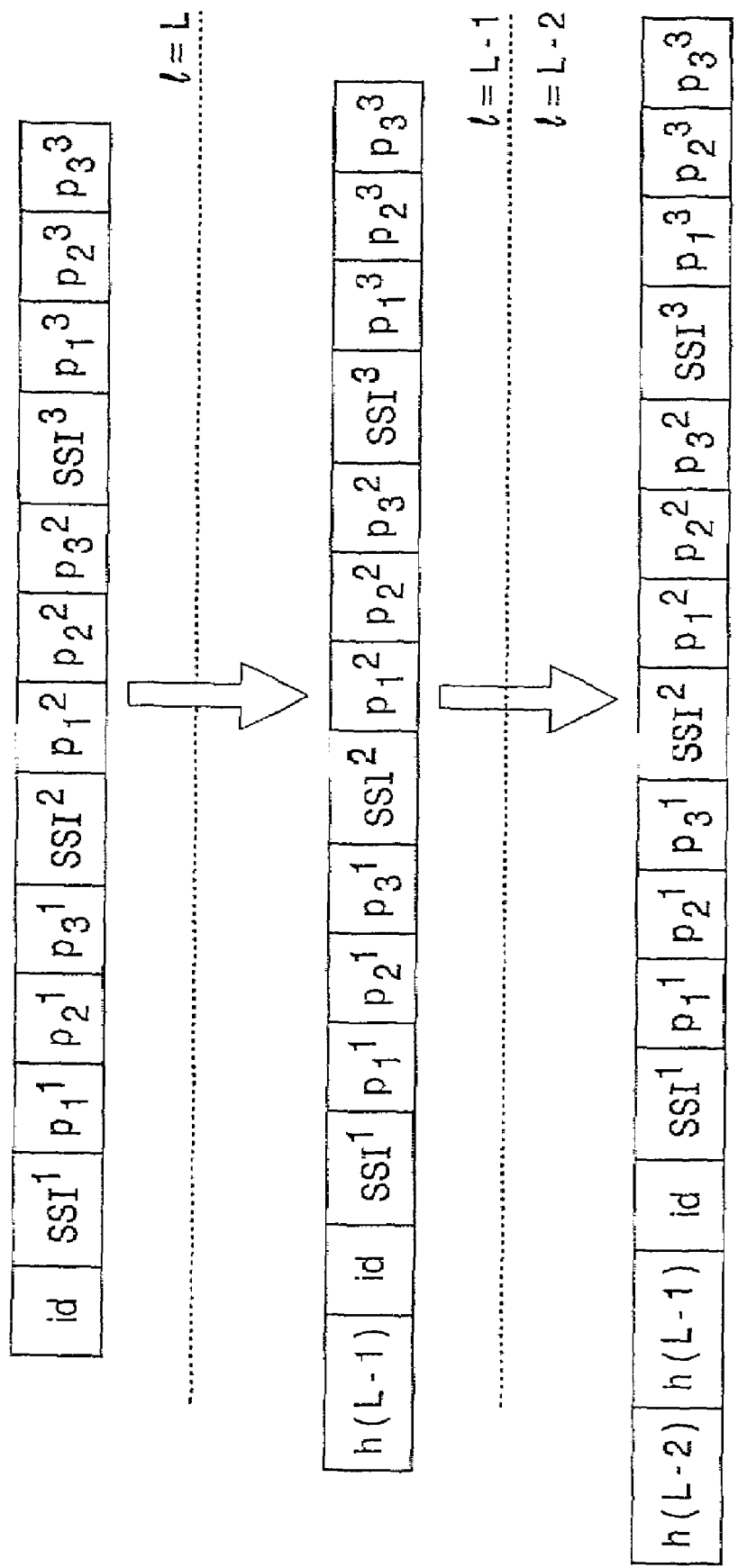
FIG. 8 shows automatic SSI header detection using an identifier according to an embodiment of the invention.

FIG. 8 shows an embodiment for SSI header detection using an identifier according to an embodiment of the invention. By inserting an identifier in the coded data stream, a channel encoder according to the invention easily identifies the SSI header associated with the identifier. In this embodiment, it is not necessary at each intermediate layer to update and replace the first SSI header at the beginning of the coded data stream. In fact, it is not necessary to identify and process the first SSI header at each intermediate layer. Therefore, prior art intermediate coding can be used. Subsequent headers h(L−1), h(L−2), etc. are just placed in front of the first SSI header.

Figure 9:
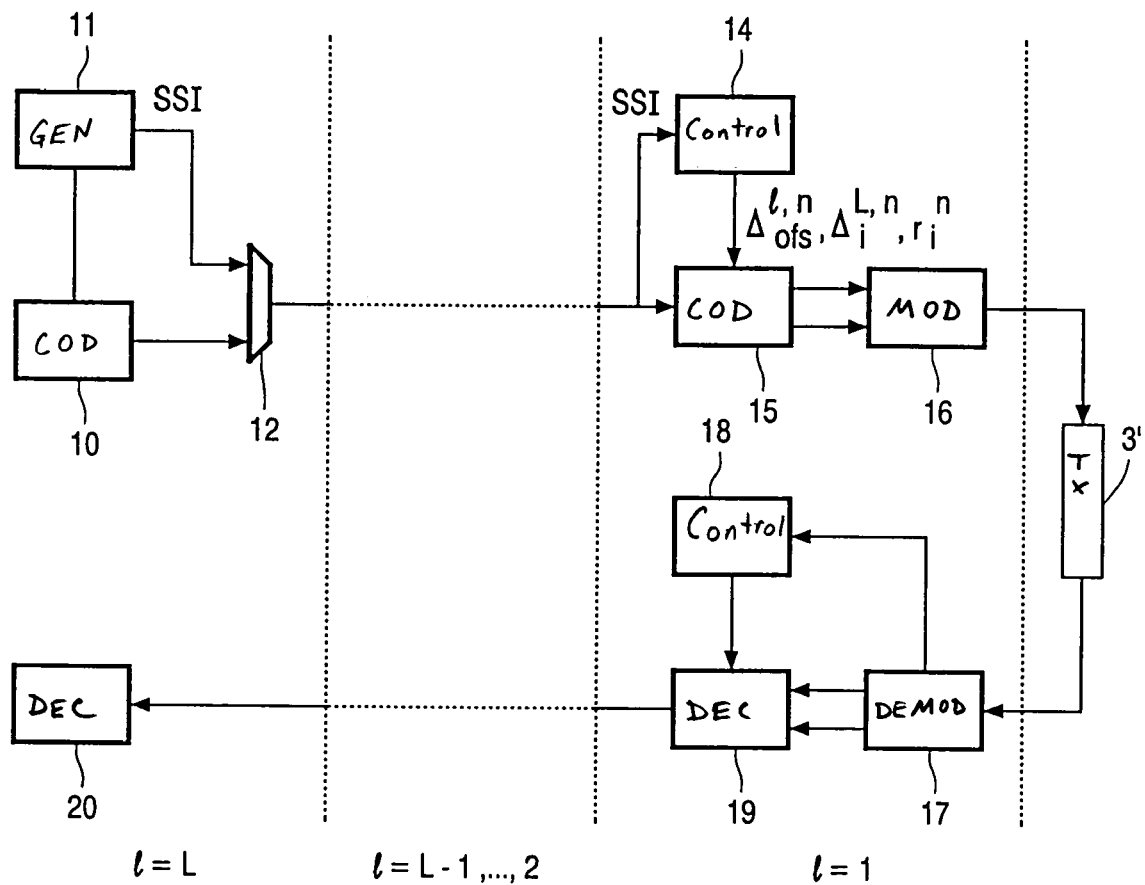
FIG. 9 shows a block diagram of a system according to another embodiment of the invention.

FIG. 9 shows a block diagram of an implementation of UEP without SSI management at the intermediate layers. The elements shown in FIG. 9 are similar to the elements shown in the implementation of FIG. 7. Differences are that the SSI header insertion unit 11 has now been arranged to include an identifier in the coded data stream, the identifier being associated to the first SSI header and preferably put in the coded bit-stream just before the first SSI header. In this way, the SSI header can be easily identified in the channel encoder 15. Because it is not necessary to replace the SSI header at the beginning of the coded data stream in each intermediate layer processing, no additional processing is necessary in the intermediate layers. A further difference with FIG. 7 is that the controller 14 now has been arranged to identify the SSI header identifier. In the case that the SSI header is channel coded and transmitted, unit 18 in this embodiment has been arranged to detect the identifier. The identifier may be designed such that detection at the receiving side is sufficiently robust against channel errors. It is not necessary to channel code such an identifier. Channel coding of the SSI headers still remains necessary.

When groups of packets are broken up, smaller groups of packets are generated. First packets of these smaller groups can each be handled as described above.

Preferred application fields of the invention are mobile phones and mobile communication devices.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word 'comprising' does not exclude the presence of other elements or steps than those listed in a claim. The invention can be implemented by means of hardware comprising several distinct elements, and by means of a suitably programmed computer. In a device claim enumerating several means, several of these means can be embodied by one and the same item of hardware. The mere fact that certain measures are recited in mutually different dependent claims does not indicate that a combination of these measures cannot be used to advantage.

In summary, the invention provides signal coding, wherein the signal is source coded to obtain a coded data stream, and source significance information is included into the coded data stream, the source significance information indicating desired protection rates of respective parts of the coded data stream. In this way, a channel encoder may obtain the source significance information from the coded data stream, which is advantageous in presence of intermediate network layers. Preferably, the coded data stream comprises respective packets, the being included in respective headers associated with the respective packets, a given header indicating desired protection rates for respective parts of the associated packet. In order to provide easy detection of the source significance information, a first header is placed at a beginning of the coded data stream. Alternatively, the first header is provided with an identifier.

The invention claimed is:

1. A method of coding a signal, the method comprising:
source coding, using a source coder, the signal to obtain a coded data stream;
including source significance information, using a SSI header generation unit and a multiplexer, into the coded data stream, the source significance information indicating desired protection rates of respective parts of the coded data stream.

2. The method as claimed in claim 1, wherein the source significance information comprises respective lengths of the respective parts of the coded data stream.

3. The method as claimed in claim 1, wherein the coded data stream comprises respective packets, the source significance information being included in respective headers associated with the respective packets, a given header indicating desired protection rates for respective parts of the associated packet.

4. The method as claimed in claim 3, wherein an offset is included in the given header, the offset indicating a start position of the associated packet.

5. The method as claimed in claim 3, wherein the coded data stream comprises respective groups of packets, in which method a first header associated to a first packet of the group of packets is placed at a beginning of the coded data stream.

6. The method as claimed in claim 3, wherein the coded data stream comprises respective groups of packets, in which method a first header associated to a first packet of the group of packets is provided with an identifier.

7. The method as claimed in claim 6, wherein the identifier is placed just in front of the first header.

8. A method of coding a coded data stream, comprising:
generating the coded data stream comprising respective groups of packets, generated by a source coder and a first header, generated by a SSI header generation unit and multiplexed by a multiplexer to be present at a beginning of the coded data stream, the first header being associated with a first packet of the group of packets and comprising source significance information including an offset indicating a start position of the associated first packet;
including, using an intermediate coder, a further header in the coded data stream;
replacing, using the intermediate coder, the first header at the beginning of the coded data stream; and
updating, using the intermediate coder, the offset in the first header.

9. A method of channel encoding, the method comprising:
receiving a coded data stream, in which source significance information has been included, the source significance information indicating desired protection rates of respective parts of the coded data stream;
identifying, using a controller, the source significance information in the coded data stream; and
channel coding, using a channel encoder, respective parts of the coded bit-stream with respective protection rates under control of the source significance information.

10. A method of channel decoding, the method comprising:
receiving, using a demodulator, a channel coded data stream, in which source significance information has been incorporated, the source significance information indicating protection rates of respective parts of the channel coded data stream;
identifying, using a controller, the source significance information in the channel coded data stream; and
channel decoding, using a channel decoder, respective parts of the channel coded data stream with respective protection rates under control of the source significance information.

11. A device for coding a signal, the device comprising:
means for source coding the signal to obtain a coded data stream;
means for including source significance information into the coded data stream, the source significance information indicating desired protection rates of respective parts of the coded data stream.

12. A device, comprising:
means for coding a coded data stream, the coded data stream comprising respective groups of packets and a first header present at a beginning of the coded data stream, the first header being associated with a first packet of the group of packets and comprising source significance information including an offset indicating a start position of the associated first packet;
means for including a further header in the coded data stream;
means for replacing the first header at the beginning of the coded data stream; and
means for updating the offset in the first header.

13. A channel coder comprising:
means for receiving a coded data stream, in which source significance information has been included, the source significance information indicating desired protection rates of respective parts of the coded data stream;
means for identifying the source significance information in the coded data stream; and
means for channel coding respective parts of the coded bit-stream with respective protection rates under control of the source significance information.

14. A channel decoder comprising:
means for receiving a channel coded data stream, in which source significance information has been incorporated, the source significance information indicating protection rates of respective parts of the channel coded data stream;
means for identifying the source significance information in the channel coded data stream; and
means for channel decoding respective parts of the channel coded data stream with respective protection rates under control of the source significance information.

15. A computer-readable medium having stored thereon a coded data stream formed by source coding a signal forming a source coded signal, and including source significance information into the source coded stream, the source significance information indicating desired protection rates of respective parts of the coded data stream.

* * * * *